United States Patent
Li et al.

(10) Patent No.: US 10,443,530 B1
(45) Date of Patent: Oct. 15, 2019

(54) SYSTEM WITH SOLENOID ASSEMBLY AND METHOD OF FAULT DIAGNOSIS AND ISOLATION

(71) Applicant: GM Global Technology Operations LLC, Detroit, MI (US)

(72) Inventors: Shifang Li, Shelby Township, MI (US); Azeem Sarwar, Rochester Hills, MI (US); Thomas W. Nehl, Shelby Township, MI (US)

(73) Assignee: GM Global Technology Operations LLC., Detroit, MI (US)

( * ) Notice: Subject to any disclaimer, the term of this patent is extended or adjusted under 35 U.S.C. 154(b) by 0 days.

(21) Appl. No.: 15/986,282

(22) Filed: May 22, 2018

(51) Int. Cl.
| | |
|---|---|
| *F02D 41/22* | (2006.01) |
| *H01F 7/06* | (2006.01) |
| *H01F 7/16* | (2006.01) |
| *H01F 7/08* | (2006.01) |
| *H01F 7/18* | (2006.01) |
| *G07C 5/08* | (2006.01) |
| *G01R 31/06* | (2006.01) |
| *G01R 19/10* | (2006.01) |
| *G01R 19/25* | (2006.01) |
| *F02M 51/04* | (2006.01) |

(52) U.S. Cl.
CPC ........... *F02D 41/221* (2013.01); *F02M 51/04* (2013.01); *G01R 19/10* (2013.01); *G01R 19/25* (2013.01); *G01R 31/06* (2013.01); *G07C 5/0841* (2013.01); *H01F 7/064* (2013.01); *H01F 7/081* (2013.01); *H01F 7/16* (2013.01); *H01F 7/1844* (2013.01); *F02D 2200/101* (2013.01)

(58) Field of Classification Search
CPC .. F02D 41/22; F02D 41/221; F02D 2200/101; F02M 51/04; G07C 5/0841; G01R 19/10; G01R 19/25; G01R 31/06; H01F 7/064; H01F 7/081; H01F 7/16; H01F 7/1844
See application file for complete search history.

(56) References Cited

U.S. PATENT DOCUMENTS

| | | | | |
|---|---|---|---|---|
| 4,736,267 | A * | 4/1988 | Karlmann | F02D 41/20 123/490 |
| 6,024,071 | A * | 2/2000 | Heimberg | F02D 41/20 123/490 |
| 7,273,038 | B2 * | 9/2007 | Hayakawa | F02D 41/20 123/478 |
| 8,020,533 | B2 * | 9/2011 | Tsuchiya | F02M 51/0603 123/478 |

* cited by examiner

*Primary Examiner* — Hieu T Vo
(74) *Attorney, Agent, or Firm* — Quinn IP Law

(57) ABSTRACT

A solenoid assembly includes a solenoid having a coil, a current sensor configured to measure the coil current, and a controller. The controller estimates the coil current using a solenoid model, with output of the solenoid model being an estimated coil current, and receives the measured coil current from the current sensor. The controller also calculates an error value having an error sign by subtracting the estimated coil current from the measured coil current. Responsive to the error value exceeding a calibrated error threshold while the control voltage deviates from a nominal value, the controller diagnoses a solenoid fault condition. Responsive to diagnosing the solenoid fault condition, the controller isolates or identifies a particular solenoid fault condition from among a plurality of possible fault conditions, and records a diagnostic code indicative of the particular solenoid fault condition.

20 Claims, 3 Drawing Sheets

SYSTEM WITH SOLENOID ASSEMBLY AND METHOD OF FAULT DIAGNOSIS AND ISOLATION

INTRODUCTION

The present disclosure relates to the automatic diagnosis and identification or isolation of electrical fault conditions in the overall control of a solenoid assembly. A solenoid is an electromagnetic circuit in which a coil of conductive wire is wound around a ferromagnetic core. A magnetic field is generated when coil is energized, which in turn translates an armature or plunger within a solenoid body. A spring returns the plunger back to its starting position when the magnetic field is discontinued. Solenoid assemblies are employed in a wide array of systems, such as in the control of valves or actuators.

SUMMARY

A system is disclosed herein that includes a solenoid assembly and a controller-based method for diagnosing and isolating certain electrical faults occurring within the solenoid assembly. By way of example, corroded or loose electrical connections tend to increase the internal resistance of an electrical circuit having such connections, and thus may reduce the electrical current flowing through the circuit. The reduction in current, particularly in the coil of the solenoid, may impede movement of a solenoid-controlled device, for instance a valve in an example embodiment. Similarly, cyclic loading of the solenoid causes premature wear of electrical insulation on the solenoid coil. Such a result is largely due to thermo-mechanical stress, and may eventually result in shorted turns or another short circuit condition. Shorted turns decrease coil resistance and inductance, with coil current circulating through the shorted turns behaving like eddy currents to oppose flux changes in the core. This may result in a spike in coil current for a given pulse width modulation (PWM) control voltage, with a concomitant change in performance of the solenoid and the solenoid-controlled device.

The controller is therefore configured, via execution of computer-readable instructions embodying a disclosed method, to estimate the coil current while the coil is energized. Estimation may occur using a dynamic model. Such a model may consider a fictitious eddy current in an eddy current loop of the solenoid based at least partially on an applied coil voltage. The controller also considers coil resistance and eddy current loop resistance, eddy current location, the number of turns in the coil/coil turn number, steady-state core inductance, and a sampling time of the controller as part of the present approach.

As part of the method, the controller receives a measured coil current and compares the measured coil current to the estimated coil current. Based on the results of the comparison, the controller automatically diagnoses and isolates, i.e., uniquely identifies, and thus provides prognosis of the likely electrical fault condition. The controller also initiates appropriate corrective action, including recording a diagnostic code corresponding to the diagnosed fault.

In a particular embodiment, the solenoid assembly includes a solenoid, a current sensor, and a controller. The solenoid includes a coil. Magnetic flux is generated when a solenoid control voltage is applied to the coil, which causes a coil current to flow through the coil. The current sensor measures the coil current and outputs a measured coil current. The controller is in communication with the solenoid, and is configured to estimate the coil current using a solenoid model, with an estimated coil current being an output of the solenoid model.

The controller receives the measured coil current and calculates an error value, i.e., by subtracting the estimated coil current from the measured coil current. Responsive to the error value exceeding a calibrated error threshold while the control voltage deviates from a nominal value, the controller diagnoses a solenoid fault condition. Responsive to diagnosis of the solenoid fault condition, the controller isolates a particular solenoid fault condition from among a plurality of possible solenoid fault conditions, and then records a diagnostic code indicative of the particular solenoid fault condition.

The solenoid model may be a dynamic model, e.g., using the estimated coil current as a state variable. Such a dynamic model may use the PWM control voltage as a control input. Model parameters may include each of a fictitious eddy current in an eddy current loop of the solenoid, a resistance of the coil, a resistance of the eddy current loop, a location of the eddy current, a coil turn number of the coil, an inductance of the core at steady state condition, and a sampling time of the controller.

The solenoid assembly may be configured for use in a system having a solenoid-controlled device that is controlled by the solenoid. In such an embodiment, the controller may be configured to normalize the measured coil current, the estimated coil current, and the control voltage over a plurality of operating conditions of the system prior to calculating the error value.

The system may include an engine, with the solenoid in such an embodiment possibly being part of a fuel pump or other fuel injection system component for such an engine. The operating conditions in this instance may include a range of engine speeds.

The possible fault conditions may include a short circuit fault in the solenoid when the error sign is positive and a faulty electrical connection in an electrical circuit feeding the solenoid when the sign is negative.

The controller may be further configured, responsive to the error value exceeding the calibrated error threshold while the control voltage does not deviate from the nominal value, recording a diagnostic code indicative of a current sensing fault condition.

A fuel injection system is also disclosed herein for use with an engine and a fuel supply. The fuel injection system may include a fuel rail in fluid communication with the engine, a fuel pump, and a solenoid assembly. The solenoid assembly includes an intake valve that is in fluid communication with the fuel pump and the fuel supply, an exhaust valve disposed between the fuel pump and the fuel rail, a solenoid, a current sensor, and a controller.

A method is also disclosed for diagnosing and identifying a fault condition in a solenoid assembly. The method may include energizing a coil of a solenoid by applying a solenoid control voltage to the coil such that a coil current flows through the coil and magnetic flux is generated with respect to the coil. The method also includes measuring the coil current using a current sensor, and then estimating the coil current via a controller using a solenoid model. An output of the solenoid model is an estimated coil current. Additionally, the method may include calculating an error value having an error sign by subtracting the estimated coil current from the measured coil current from the current sensor. Responsive to the error value exceeding a calibrated error threshold while the control voltage deviates from a nominal voltage value, the method includes diagnosing a solenoid fault condition. Responsive to diagnosing the solenoid fault condition, the method further includes identifying a particular solenoid fault condition from among a plurality of possible solenoid fault conditions. A control action is then executed with respect to the solenoid assembly, including recording a diagnostic code indicative of the particular solenoid fault condition.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

Figure 1:
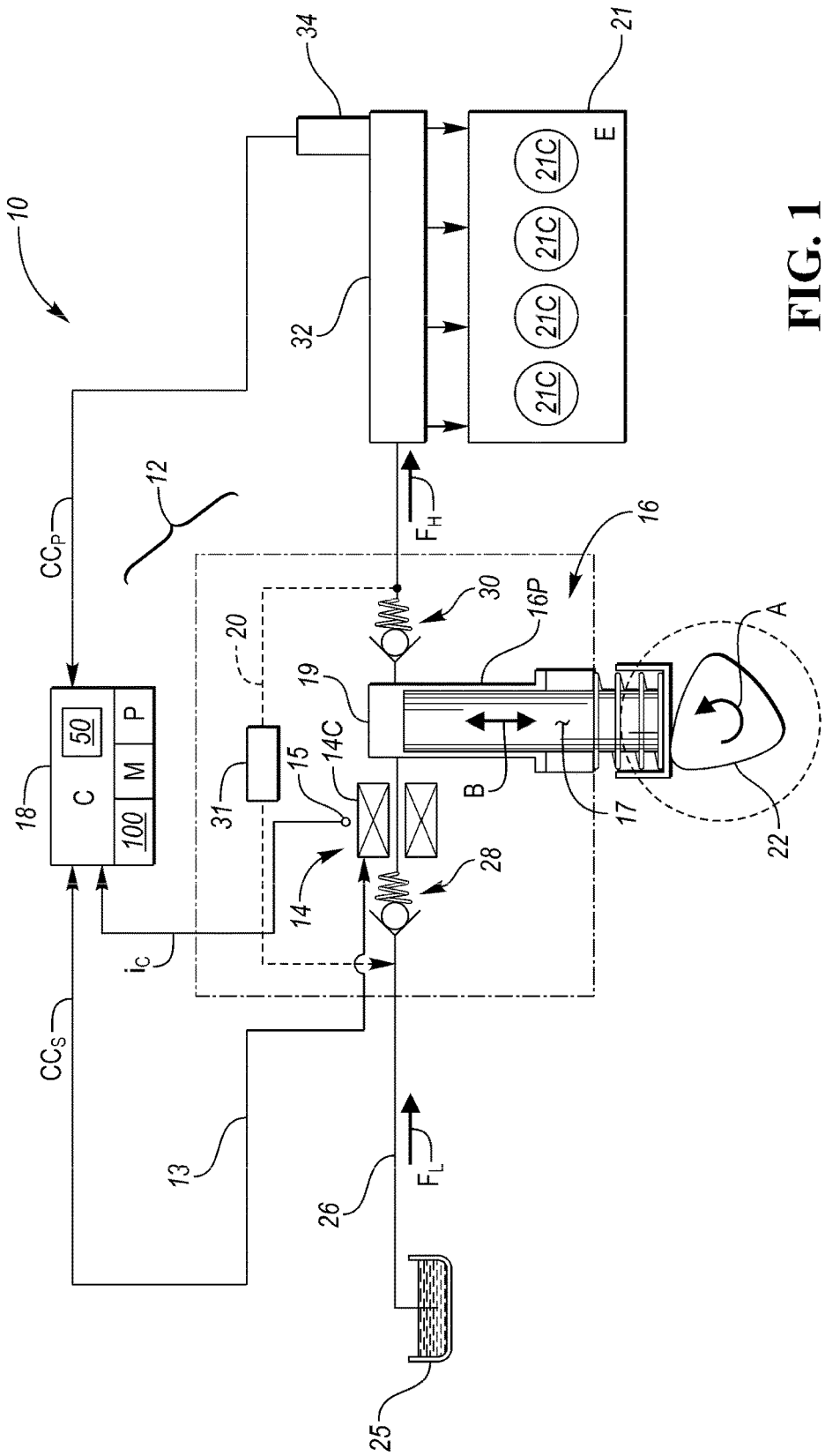
FIG. 1 is a schematic illustration of a solenoid assembly having a solenoid and controller configured to execute a method for the diagnosis and prognosis of the solenoid as set forth herein.

The present disclosure is susceptible to modifications and alternative forms, with representative embodiments shown by way of example in the drawings and described in detail below. Inventive aspects of this disclosure are not limited to the particular forms disclosed. Rather, the present disclosure is intended to cover modifications, equivalents, combinations, and alternatives falling within the scope of the disclosure as defined by the appended claims.

DETAILED DESCRIPTION

Referring to the drawings, wherein like reference numbers refer to like components, FIG. 1 schematically illustrates a system 10 having a solenoid assembly 12. The solenoid assembly 12 includes a solenoid 14, a solenoid-controlled device 16, and a controller (C) 18. The controller 18 includes a processor (P) and memory (M) within which is recorded instructions for executing the method 100. The memory (M) stores controller-executable instruction sets that the processor (P) executes in conducting the method 100 for real-time operational diagnosis and prognosis of the solenoid 14.

As shown in the non-limiting embodiment of FIG. 1, the system 10 may be a high-pressure fuel injection system for an internal combustion engine (E) 21. Such a system 10 may include a fuel pump 16P as the solenoid-activated device 16. Such a fuel pump 16P may be used, for instance, in a motor vehicle, a robot, or a mobile platform, or of an aeronautical, marine, or rail-based vehicle using the engine 21. In such an embodiment, a valve assembly controls the flow of fuel to a fuel rail 32. A cam 22 may be coupled to the engine 21, with the connection omitted for clarity, so as to rotate in conjunction with the engine 21, with such rotation of the cam 22 indicated by arrow A. A piston 17 of the fuel pump 16P rides on the cam 22 and linearly translates in response to rotation of the cam 22 as indicated by arrow B, with movement of the piston 17 toward the cam 22 corresponding to an intake stroke and movement away from the cam 22 corresponding to a compression stroke, as will be appreciated in the art.

As part of the exemplary embodiment of the system 10 of FIG. 1, a fuel line 26 delivers fuel at low pressure (arrow $F_L$) from a low pressure fuel supply 25 to the fuel pump 16P via an intake valve 28 when the solenoid 14 is energized. Fuel is compressed by the piston 17 within a cylinder 19 and discharged through an exhaust valve 30 into the fuel rail 32 as high-pressure fluid (arrow $F_H$), and ultimately to cylinders 21C of an internal combustion engine 21. A relief valve 31 on a by-pass line 20 may selectively shuttle fuel between the intake valve 28 and the exhaust valve 30 to balance pressure responsive to fuel pressure signals (arrow $CC_P$) communicated to the controller 18 by a pressure sensor 34, e.g., disposed on the fuel rail 32. The solenoid-controlled device 16 may be alternatively embodied as other types of valves, as an actuator of a starter system of the engine 21, e.g., to engage a pinion gear with a starter motor (not shown), or as part of another linear actuator, and therefore the example fuel injection system embodiment of system 10 is illustrative of the general concepts and non-limiting.

Regardless of the specific embodiment of the system 10 and the solenoid-control device 16 used therein, the solenoid 14 of FIG. 1 is responsive to a solenoid control signal (arrow CCs) generated by the controller 18. The solenoid control signal (arrow CCs) is an electronic control signal generated by the controller 18 and transmitted over a transfer conductor 13, e.g., a low-voltage line or wirelessly in some embodiments. The solenoid control signal (arrow CCs) may be a pulse width modulation (PWM) voltage, with the PWM voltage pulses having widths that correspond to a commanded linear adjustment of a plunger or armature of the solenoid 14, as will be appreciated by those of ordinary skill in the art.

As noted above, a solenoid such as the example solenoid 14 of FIG. 1 may experience a variety of possible faults. By way of example, a corroded or loose electrical connection or shorted turns of a coil 14C of the solenoid 14 may develop over time. In the non-limiting example system 10 of FIG. 1, such faults may lead to a failure of the valves 28, 30, and/or 31 to open or close when required. In turn, this may result in abnormal pressure at the fuel rail 32 and compromising of the performance of engine 21. Other systems 10 may likewise experience undesirable consequences of undiagnosed faults, such as unreliable actuation or a failure to start mode depending on the nature of the system 10.

To properly diagnose and isolate such faults from among a plurality of possible fault modes, the controller 18 is programmed to execute the method 100 during operation of the system 10. The controller 18 may be embodied as one or more digital computers each having a processor (P), e.g., a microprocessor or central processing unit, as well as memory (M) in the form of read only memory, random access memory, electrically-programmable read only memory, etc., a high-speed clock, analog-to-digital and digital-to-analog circuitry, input/output circuitry and devices, and appropriate signal conditioning and buffering circuitry.

The controller 18 may also store algorithms and/or computer executable instructions in memory (M), including the underlying algorithms or code embodying the method 100. As part of the method 100, a current sensor 15 may be positioned with respect to the coil 14C of solenoid 14, with the current sensor 15 reporting a measured coil current (arrow $i_C$) to the controller 18. The controller 18 also estimates the coil current using a model 50, e.g., a dynamic model or state model using coil current as a state variable, an example of model 50 being described in detail below.

Figure 2:
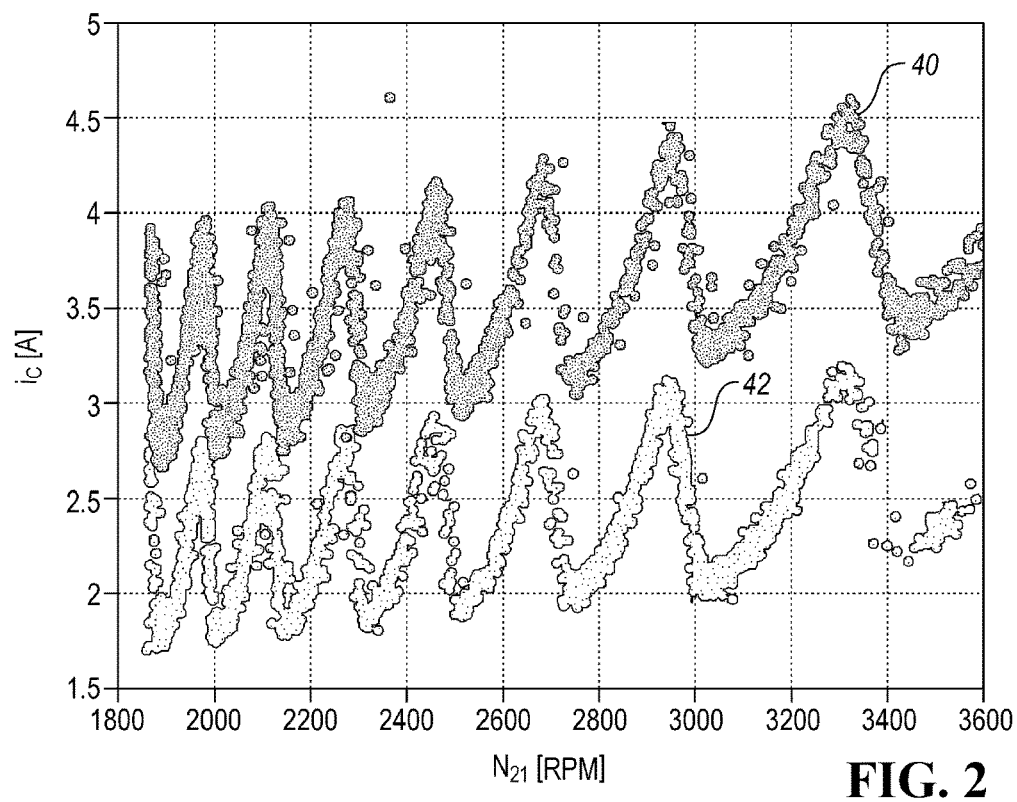
FIG. 2 illustrates changing coil current and engine speed for nominal and high-resistance circuits, respectively, with current depicted on the vertical axis and engine speed depicted on the horizontal axis.
Figure 3:
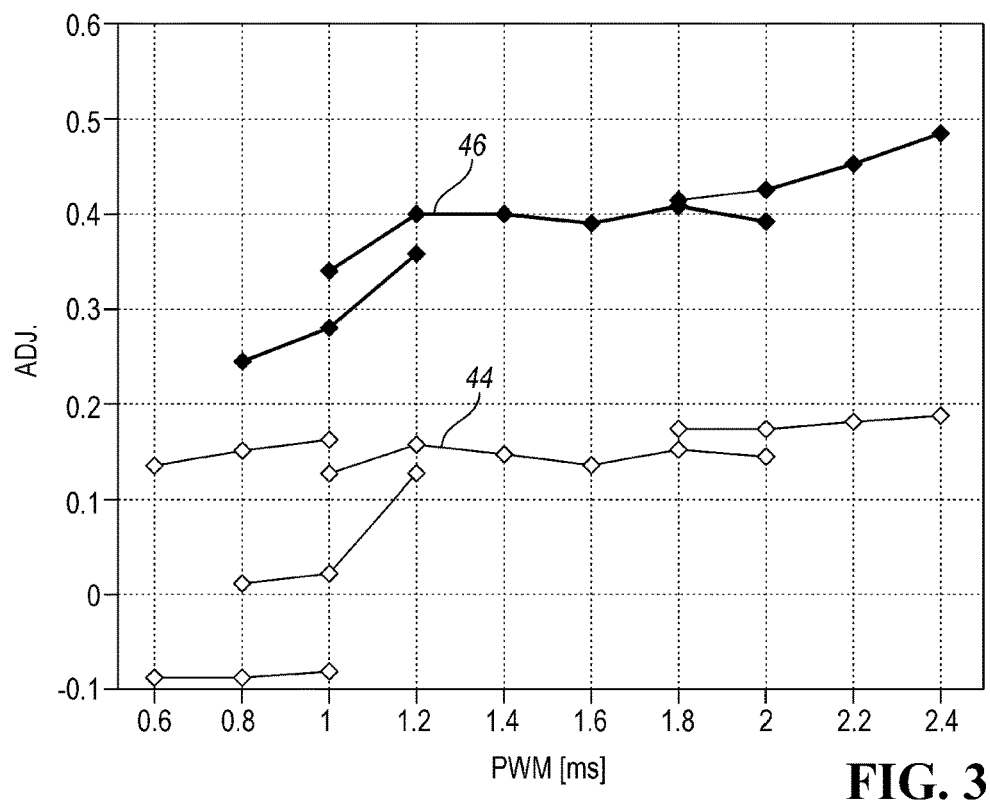
FIG. 3 illustrates solenoid adjustment and a corresponding pulse width for nominal and high-resistance circuits, respectively, with solenoid adjustment depicted on the vertical axis and pulse width depicted on the horizontal axis.

FIGS. 2 and 3 depict example effects of representative fault modes. In FIG. 2, trace 40 represents, for a nominal/properly performing solenoid 14 of FIG. 1, data points of changing solenoid coil current ($i_C$) in amps (A) with increasing engine speed ($N_{21}$) in revolutions per minute (RPM). Certain fault modes may lead to an increase in electrical resistance within the solenoid 14 itself, however, such that the coil current ($i_C$) drops. This undesirable effect of increased resistance is represented by the data points forming trace 42.

Likewise, FIG. 3 includes traces 44 and 46, which are representative pulse widths in milliseconds (ms) during a PWM switching control operation of the solenoid 14 for a nominal and a higher resistance solenoid 14, respectively. Thus, faults leading to higher resistance within the solenoid 14 affect the required PWM control adjustments (ADJ, shown on the vertical axis), and in turn may slow movement of the solenoid-controlled device 16 of FIG. 1. The early detection, diagnosis, and correction of such faults are therefore desirable in the overall control of the solenoid-controlled device 16.

Figure 4:
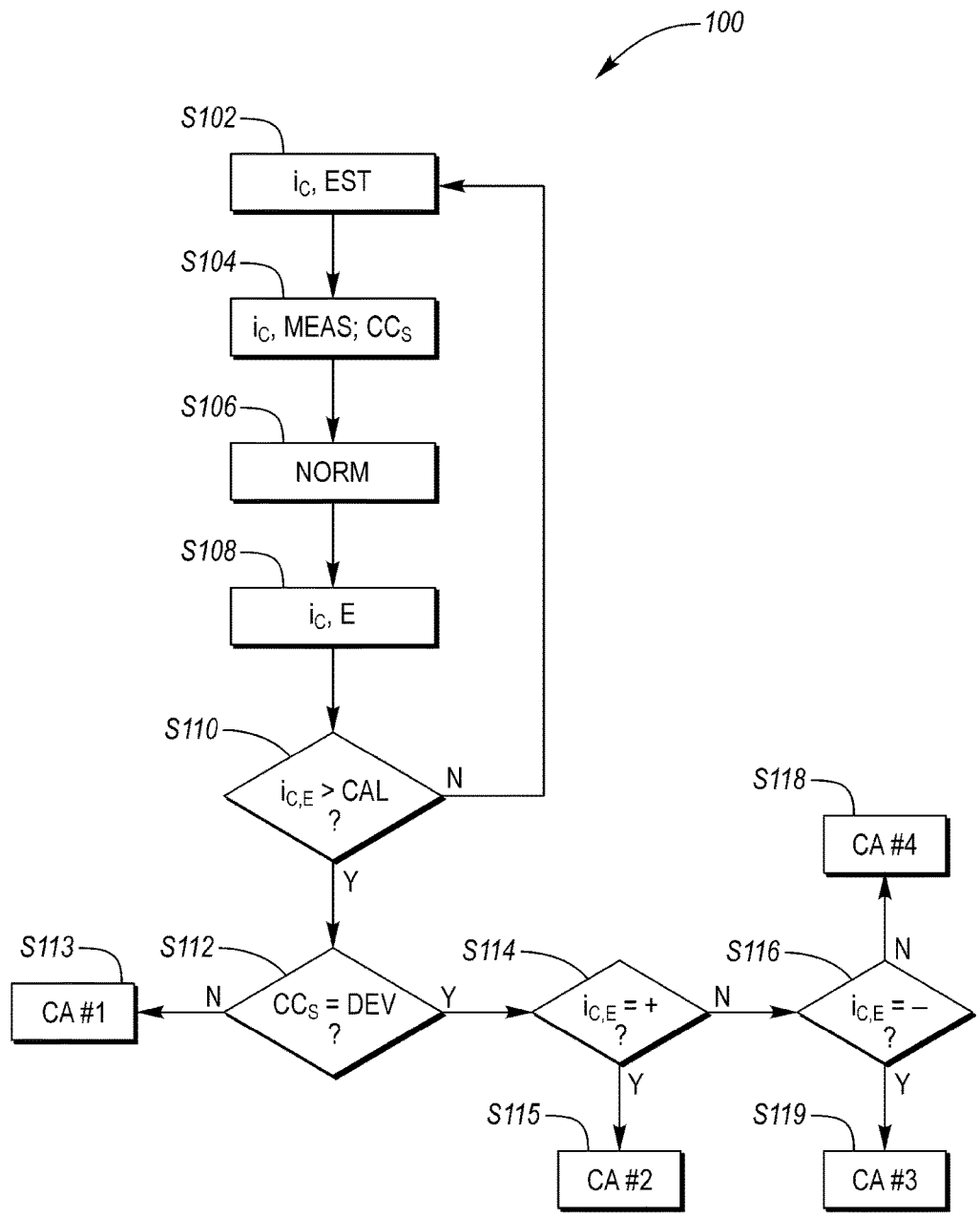
FIG. 4 is a schematic flow diagram of an example embodiment of the present method executable by the controller of FIG. 1.

Referring to FIG. 4, an exemplary embodiment of the method 100 is shown for diagnosis and prognosis of the solenoid 14 described above and depicted schematically in FIG. 1. The method 100 includes energizing the coil 14C of solenoid 14 by applying a control voltage, i.e., the solenoid control signal (arrow CCs) to the coil 14C such that the coil current ($i_C$) flows through the coil 14C and magnetic flux is generated with respect to the coil 14C.

With the coil 14C so energized, the method 100 commences at step S102, with the controller 18 generating an estimated coil current ($i_{C,\,EST}$) using the model 50. For instance, the controller 18 may use, as the model 50, a transient state model. In such an example, the controller 18 considers fictitious eddy currents, e.g., theoretically possible, modeled, or determined offline. Such a fictitious eddy current represents eddy currents that flow throughout solid electrically-conducting parts of the solenoid 14 in a two-state variable electrical model. Such eddy currents may flow in closed loops in planes perpendicular to the magnetic field.

In a possible embodiment of the model 50 noted above, step S102 may entail estimating the coil current, $i_1$ below corresponding to $i_{C,\,EST}$, as a function of the PWM voltage command, V(k), as well as of a steady-state inductance (L), coil turn number (N), coil 14C resistance ($R_1$), eddy current loop resistance ($R_2$), and eddy current location (s), i.e., a normalized distance of the eddy currents relative to the coil 14C, as well as the sampling time ($\Delta T$) of the controller 18. Of these values, the voltage command V(k), which corresponds to solenoid control signal (arrow CCs) of FIG. 1, is a PWM voltage command delivered from a driver circuit of the solenoid 14, e.g., resident in the controller 18 for illustrative simplicity but possibly located apart from the controller 18. The voltage command V(k) has a corresponding coil current ($i_1$), with the resistances $R_1$ and $R_2$ possibly determined offline and stored in memory (M) of the controller 18, e.g., in a lookup table. Likewise, the coil turn number (N), inductance (L), and eddy current location (s) may be measured or modeled offline and recorded in memory (M) as predetermined values for rapid lookup by the controller 18 during execution of step S102.

Thus, step S102 in this exemplary embodiment may entail the controller 18 solving the following dynamic model:

$$\begin{bmatrix} i_1(k+1) \\ i_2(k+1) \end{bmatrix} = \begin{bmatrix} 1 - L^{-1}\frac{R_1}{-s^2 + 2s}\Delta T & L^{-1}\frac{NR_2}{-s^2 + 2s}\Delta T \\ L^{-1}\frac{NR_1}{-s^2 + 2s}\Delta T & 1 - L^{-1}\frac{N^2 R_2}{-s^4 + 4s^3 - 5s^2 + 2s}\Delta T \end{bmatrix}$$

$$\begin{bmatrix} i_1(k) \\ i_2(k) \end{bmatrix} + \begin{bmatrix} L^{-1}\frac{1}{-s^2 + 2s}\Delta T \\ L^{-1}\frac{N}{-s^2 + 2s}\Delta T \end{bmatrix} V(k)$$

Output $i_1(k)$ of the above relationship may be expressed as:

$$i_1(k) = [1\ 0]\begin{bmatrix} i_1(k) \\ i_2(k) \end{bmatrix}$$

The method 100 proceeds to step S104 once coil current has been estimated.

Step S104 includes collecting coil current measurements and control signal data, i.e., $i_C$ and CCs of FIG. 1, across a wide range of different operating conditions. As used herein, the operating conditions are specific to the solenoid-controlled device 16 and the system 10, and may include, for instance, different engine or other input speeds, operating temperatures, etc. The method 100 proceeds to step S106.

At step S106, the controller 18 may normalize the collected data from steps S102 and S104 over the various operating conditions of step S104 before proceeding to step S108.

At step S108, the controller 18 next calculates an error value ($i_{C,E}$) as a difference between the coil current value as estimated at step S102 and the coil current as measured at step S104, possibly once normalized at step S106 or directly in other embodiments. Step S108 may entail using the controller 18 to solve the following equation:

$$I_{n,e} = I_{n,meas} - I_{n,est}$$

In the above equation, $I_{n,e}$ is the normalized error and $I_{n,meas}$ and $I_{n,est}$ are the normalized measured and estimated coil currents, respectively. Therefore, the calculated error may have a positive or a negative error sign. The method 100 continues to step S110 once the controller 18 has calculated the normalized error value.

Step S110 includes comparing the absolute value of the normalized error value determined at step S108 to a predetermined error threshold (CAL). The method 100 repeats step S102 when the absolute value of the error value from step S108 is less than the predetermined error threshold, and proceeds to step S112 when the absolute error exceeds the error threshold.

At step S112, the controller 18 determines whether the solenoid control signal (arrow CCs of FIG. 1) is deviating (DEV) from calibrated nominal control signal values, i.e., changing by more than a predetermined amount over time. Step S112 may entail using a comparator circuit to compare corresponding voltages of the solenoid control signal and calibrated nominal control signal values. The method 100 proceeds to step S113 when no such deviation is detected, and to step S114 in the alternative.

Step S113 includes executing a first control action (CA#1) with respect to the solenoid 14 of FIG. 1 responsive to a determination that the threshold error is present concurrently with no deviation in the solenoid control signal (CCs) from nominal values. Step 113 includes registering a corresponding diagnostic code in memory (M) of the controller 18 that is indicative of a possible logic fault of the controller 18. Such a result may be due to a current sensing error, and therefore the diagnostic code may request repair or replacement of current sensing hardware or logic components within the controller 18.

Step S114 is arrived at upon a determination by the controller 18 of threshold error concurrently with deviation of the solenoid control signal (CCs) from nominal values. Responsive to such conditions, the controller 18 determines if the sign of the error value from step S108 is positive. If so, the method 100 proceeds to step S115. The method 100 otherwise proceeds to step S116 when the sign is not positive.

At step S115, the controller 18 executes a second control action (CA#2) with respect to the solenoid 14 of FIG. 1 responsive to a determination that the threshold error is present concurrently with deviation in the solenoid control signal (CCs) from nominal values. Step 115 includes registering a corresponding diagnostic code in memory (M) of the controller 18 that is indicative of a possible short circuit of the coil 14C of the solenoid 14 shown in FIG. 1. The diagnostic code may trigger an automated request for repair or replacement of the insulation of the coil 14C of the solenoid 14.

At step S116, the controller 18 determines if the sign of the error value ($i_{c,E}$) from step S108 is negative (−). The method 100 proceeds to step S119 when the error value is negative, and to step S118 when the error value is not negative.

Step S118 includes executing a third control action (CA#3) with respect to the solenoid 14 of FIG. 1 responsive to a determination that the current error from step 108 has an unknown sign. As noted above, measured and estimated currents ($i_{C,MEAS}$ and $i_{C,EST}$) signals are compared after normalization against operating conditions, e.g., engine speed, and therefore the comparison occurs over a window of data. There are multiple data points for each operating point, as evident from FIGS. 2 and 3. An unknown condition may result when data indicates a positive error while other data shows a negative error.

Estimated and measured coil currents may also be compared directly to each other, so if error is present in one direction for a calibrated time period and also crosses the calibrated error threshold, a fault may be detected. Thus, error may cross the error threshold but not do so consistently in one direction, with such a scenario also corresponding herein to unknown fault. In either case, computational uncertainty may result from a hardware or software malfunction of the controller 18. Step 118 therefore includes registering a corresponding diagnostic code in memory (M) of the controller 18 indicative of a malfunctioning controller 18. The diagnostic code may trigger an automated request for repair or replacement of the controller 18 or logic portions thereof.

Step S119 includes executing a fourth control action (CA#4) with respect to the solenoid 14 of FIG. 1 responsive to a determination that the current error from step 108 is negative and there is deviation of the solenoid control signal (CCs) from nominal values. Step 119 includes registering a corresponding diagnostic code in memory (M) of the controller 18 that is indicative of a bad connection to the solenoid circuit 18 from outside of the solenoid circuit 18, e.g., due to corroded or loose electrical connections. The diagnostic code may trigger an automated request for repair or replacement of a circuit feeding the solenoid 14.

The method 100 therefore enables solenoid current estimation, e.g., from the dynamic model described above, for isolation and prognosis of certain electrical faults in the system 10 of FIG. 1 or other systems having the solenoid 14, including but not limited to variable flow solenoids in transmissions, brake solenoids, door lock actuators, etc. Those of ordinary skill in the art in view of the disclosure will also appreciate that other control actions may be executed by the controller 18 in addition to or apart from those detailed above. For instance, the controller 18 may, depending on the sign and/or severity of the error at step S108 relative to the threshold at step S110, and/or the severity of deviation from step S112, disable operation of the faulty component proactively, either immediately or after a giving the operator notice of a remaining time before failure. One possible way to implement such an embodiment is to inform the operator, based on the rate of progression of the error, that the system 10 will be disabled after a particular duration or number of operating cycles, e.g., key on/off cycles in an example vehicle embodiment. These and other attendant benefits may be enabled using the controller 18 and method 100 noted above.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. A fuel injection system for use with an engine and a fuel supply, the fuel injection system comprising:
a fuel rail in fluid communication with the engine;
a fuel pump configured to pressurize fuel from the fuel supply;
a solenoid assembly having:
an intake valve in fluid communication with the fuel pump and the fuel supply;
an exhaust valve disposed between the fuel pump and the fuel rail;
a solenoid having a coil, wherein magnetic flux is generated with respect to the coil when a solenoid control voltage is applied to the coil;
a current sensor configured to output a measured coil current; and
a controller operatively connected to the solenoid and configured to:
estimate the coil current using a solenoid model, wherein an output of the solenoid model is an estimated coil current;
receive the measured coil current from the current sensor;
calculate an error value by subtracting the estimated coil current from the measured coil current, the error value having an error sign;
responsive to the error value exceeding a calibrated error threshold when the control voltage deviates from a nominal voltage value, diagnosing a solenoid fault condition;

responsive to diagnosing the solenoid fault condition, identifying a particular solenoid fault condition from among a plurality of possible solenoid fault conditions; and executing a control action indicative of the particular solenoid fault condition, including recording a diagnostic code indicative of the particular solenoid fault condition.

2. The fuel injection system of claim 1, wherein the solenoid model is a dynamic model.

3. The fuel injection system of claim 2, wherein the dynamic model uses the control voltage as a model input, and uses as model parameters each of: a fictitious eddy current in an eddy current loop, a resistance of the coil, a resistance of the eddy current loop, a location of the eddy current, a coil turn number of the coil, an inductance of the core at steady state condition, and a sampling time of the controller.

4. The fuel injection system of claim 1, wherein the controller is configured to normalize the measured coil current, the estimated current, and the control voltage over a plurality of operating conditions of the engine prior to calculating the error value.

5. The fuel injection system of claim 4, wherein the plurality of operating conditions includes a range of engine speeds of the engine.

6. The fuel injection system of claim 1, wherein the plurality of possible fault conditions includes a short circuit fault in the solenoid when the sign is positive and a faulty electrical connection in an electrical circuit feeding the solenoid when the sign is negative.

7. The fuel injection system of claim 1, wherein the controller is further configured, responsive to the error value exceeding the calibrated error threshold while the control voltage does not deviate from the nominal value, recording a diagnostic code indicative of a current sensing fault condition.

8. A solenoid assembly comprising:
a solenoid having a coil;
a current sensor configured to output a measured coil current when a solenoid control voltage is applied to the coil; and
a controller in communication with the solenoid and configured to:
use a solenoid model to generate an estimated coil current;
receive the measured coil current from the current sensor;
calculate an error value by subtracting the estimated coil current from the measured coil current, with the error value having an error sign;
responsive to the error value exceeding a calibrated error threshold while the solenoid control voltage deviates from a nominal voltage value, diagnosing a solenoid fault condition;
responsive to diagnosing the solenoid fault condition, identifying a particular solenoid fault condition from among a plurality of possible solenoid fault conditions; and
executing a control action with respect to the solenoid assembly, including recording a diagnostic code indicative of the particular solenoid fault condition.

9. The solenoid assembly of claim 8, wherein the solenoid model is a dynamic model.

10. The solenoid assembly of claim 9, wherein the dynamic model uses the control voltage as a model input and, as model parameters, each of a fictitious eddy current in an eddy current loop of the solenoid, a resistance of the coil, a resistance of the eddy current loop, a location of the eddy current, a coil turn number of the coil, an inductance of the core at steady state condition, and a sampling time of the controller.

11. The solenoid assembly of claim 8, wherein the solenoid assembly is configured for use in a system having a solenoid-controlled device that is controlled by the solenoid, and wherein the controller is configured to normalize the measured coil current, the estimated current, and the control voltage over a plurality of operating conditions of the system prior to calculating the error value.

12. The solenoid assembly of claim 11, wherein the system includes an engine, the solenoid is part of a fuel injection system for the engine, and the plurality of operating conditions includes a range of engine speeds of the engine.

13. The solenoid assembly of claim 8, wherein the plurality of possible solenoid fault conditions includes a short circuit fault when the error sign is positive and a faulty electrical connection of an electrical circuit feeding the solenoid when the sign is negative.

14. The solenoid assembly of claim 8, wherein the controller is further configured, responsive to the error value exceeding the calibrated error threshold while the solenoid control voltage does not deviate from the nominal value, recording a diagnostic code indicative of a current sensing fault condition.

15. A method for diagnosing and identifying a fault condition in a solenoid assembly, the method comprising:
energizing a coil of a solenoid by applying a solenoid control voltage to the coil such that a coil current flows through the coil and magnetic flux is generated with respect to the coil;
measuring the coil current using a current sensor to generate a measured coil current;
estimating the coil current via a controller using a solenoid model, wherein an output of the solenoid model is an estimated coil current;
calculating an error value by subtracting the estimated coil current from the measured coil current from the current sensor, the error value having an error sign;
responsive to the error value exceeding a calibrated error threshold while the control voltage deviates from a nominal voltage value, diagnosing a solenoid fault condition;
responsive to diagnosing the solenoid fault condition, identifying via the controller a particular solenoid fault condition from among a plurality of possible solenoid fault conditions; and
executing a control action with respect to the solenoid assembly, including recording a diagnostic code indicative of the particular solenoid fault condition.

16. The method of claim 15, wherein estimating the coil current via the controller using a solenoid model includes using a dynamic model.

17. The method of claim 16, further comprising using the control voltage as an input to the dynamic model, and using as model parameters each of a fictitious eddy current in an eddy current loop of the solenoid, a resistance of the coil, a resistance of the eddy current loop, a location of the eddy current, a coil turn number of the coil, an inductance of the core at steady state condition, and a sampling time of the controller.

18. The method of claim 15, wherein the solenoid assembly is configured for use in a system, the method further comprising: normalizing the measured coil current, the estimated coil current, and the control voltage over a plurality of operating conditions of the system prior to calculating the error value.

19. The method of claim 18, wherein the system includes an engine, the solenoid is part of a fuel injection system for the engine, and the plurality of operating conditions includes a range of engine speeds of the engine.

20. The method of claim 15, wherein the plurality of possible fault conditions includes a short circuit fault in the solenoid when the error sign is positive and a faulty electrical connection in an electrical circuit feeding the solenoid when the error sign is negative, the method further comprising: responsive to the error value exceeding the calibrated error threshold when the control voltage does not deviate from the nominal voltage value, recording a diagnostic code indicative of a current sensing fault condition.

* * * * *